United States Patent [19]

Coyle et al.

[11] Patent Number: 4,839,150
[45] Date of Patent: Jun. 13, 1989

[54] PRODUCTION OF SILICON CARBIDE

[75] Inventors: Roy T. Coyle; Phillman N. Ho, both Yorba Linda, Calif.

[73] Assignee: Union Oil Company of California, Los Angeles, Calif.

[21] Appl. No.: 50,157

[22] Filed: May 15, 1987

[51] Int. Cl.$^4$ .............................................. G01B 31/36
[52] U.S. Cl. ..................................................... 423/345
[58] Field of Search ......................................... 423/345

[56] References Cited

U.S. PATENT DOCUMENTS

| 3,085,863 | 4/1963 | Prener | 423/345 |
|---|---|---|---|
| 3,175,884 | 3/1965 | Kuhn | 23/208 |
| 3,319,785 | 5/1967 | Schroll | 209/166 |
| 3,379,647 | 4/1968 | Smudski | 423/345 |
| 3,754,076 | 8/1973 | Cutler | 423/345 |
| 4,248,844 | 2/1981 | Ramsey, Jr. et al. | 423/345 |
| 4,283,375 | 8/1981 | Horne, Jr. et al. | 423/345 |
| 4,295,890 | 10/1981 | Stroke | 501/90 |
| 4,500,504 | 2/1985 | Yamamoto | 423/345 |
| 4,504,453 | 3/1985 | Tanaka et al. | 423/345 |
| 4,606,902 | 8/1986 | Ritter | 423/345 |
| 4,637,924 | 1/1987 | Beatty et al. | 423/345 |
| 4,690,811 | 9/1987 | Kida et al. | 423/345 |

OTHER PUBLICATIONS

M. A. Janney, G. C. Wei, C. R. Kennedy, and L. A. Harris, "Carbothermal Synthesis of Silicon Carbide", Report ORNL-6169, Oak Ridge National Laboratory, Oak Ridge, Tennessee, May 1985.

B. K. Parekh and W. M. Goldberger, "Separation of Fine Size Silicon Carbide Whiskers from Coked Rice Hulls", *Minerals and Metalurgical Processing*, Nov. 1985, pp. 227–230.

*Primary Examiner*—Robert L. Stoll
*Assistant Examiner*—Lori S. Freeman
*Attorney, Agent, or Firm*—Yale S. Finkle; Robert A. Franks; Gregory F. Wirzbicki

[57] ABSTRACT

Silicon carbide is produced by a method which includes dipsersing silica in a residual oil, carbonizing the oil at elevated temperatures, and heating the carbonized dispersion to form silicon carbide. Preferably, the silica is an amorphous type. Preferred residual oils are produced by distilling away crude petroleum components at temperatures up to about 350° C. The silicon carbide product typically contains a mixture of powder and whisker configurations, and has many particles with a dimension less than about 1 micrometer.

33 Claims, No Drawings

PRODUCTION OF SILICON CARBIDE

INTRODUCTION TO THE INVENTION

This invention relates to the field of silicon compounds and, more particularly, to methods for producing silicon carbide.

Silicon carbide was first produced commercially about 1890 using a resistance furnace formed by surrounding a graphite core with a mixture of clay, carbon, and salt, and passing an electric current through the graphite; silicon carbide was formed at the center of the furnace. Later, this method (called the Acheson process) was modified by replacing the clay with silica, and by adding sawdust to increase the mixture's permeability.

Most of the silicon carbide currently being produced results from following this basic method, with minor changes: the resistance furnace is formed with a graphite core, surrounded by a finely ground mixture of silica sand and either petroleum coke or anthracite, optionally also containing a small amount of sawdust to facilitate removal of gaseous reaction products (chiefly carbon monoxide). A furnace core initially heats to about 2600° C., then cools to about 2000° C. for the majority of a run, producing very large chunks of silicon carbide which, after separation from unreacted and partially reacted feed components, can be ground to a desired particle size distribution. The primary use for silicon carbide produced in this manner is as abrasives, in the form of grain, wheels, coated products (e.g., papers), and the like.

Much interest has developed in producing silicon carbide which has smaller particle sizes than those readily obtainable from the bulk grinding procedure. Smaller particles are suited for producing sintered silicon carbide ceramics for uses such as electrical components and high temperature, wear-resistant parts such as engine components. In addition, composite materials, such as alumina reinforced with silicon carbide, are finding applications which require temperature resistance and higher strengths than are normally available from uncomposited structural materials.

Kuhn, in U.S. Pat. No. 3,175,884, describes the production of submicron silicon carbides of various crystal habits by introducing silica and carbon into a high-temperature electric arc, where the reactants are vaporized and combine to form the product.

U.S. Pat. No. 4,295,890 to Stroke is directed to the production of submicron silicon carbide particles by a gas phase reaction in a plasma apparatus. The reactants are: (1) a silicon source, which is a silane or halosilane; (2) a carbon source, which is a halogenated hydrocarbon, a hydrocarbon containing up to 12 carbon atoms, or mixtures thereof; and (3) small amounts of a boron-containing additive. Silicon carbides so produced are described as particularly suitable for fabricating high-density articles, by cold pressing and sintering.

A study of different synthetic procedures is contained in a report by M. A. Janney, G. C. Wei, C. R. Kennedy, and L. A. Harris, "Carbothermal Synthesis of Silicon Carbide," ORNL-6169, Oak Ridge National Laboratory, Oak Ridge, Tennessee, published in May 1985. Submicron silicon carbide was prepared by a carbothermic reduction of a "gel precursor," formed by mixing colloidal silica and a solution of a carbon precursor. Specifically, mixtures were made of: colloidal silica and an aqueous sucrose solution; colloidal silica and a solution of pitch in toluene; methyltrimethoxysilane and an acetone solution of a phenolic resin; and methyltrimethoxysilane plus an aqueous sucrose solution. All of the silicon carbide products are reported to be suitable for the fabrication of high-density articles, but the colloidal silica-pitch reactants are described as yielding undesirable partially sintered spherical agglomerates, ranging in size from 20 to 50 micrometers.

Very significant commercial forms of silicon carbide are the "whiskers" produced by pyrolyzing rice hulls, a method first described by Cutler in U.S. Pat. No. 3,754,076 and refined by several subsequent workers. Whiskers, which are elongated particles frequently having a submicron cross-sectional dimension, are particularly useful as a reinforcing material in composites where the matrix is a polymer, a metal, or a ceramic. A "continuous" production of silicon carbide granules and whiskers is shown in U.S. Pat. No. 4,637,924 to Beatty et al., which states that the feed material for the process can be rice hulls or mixtures of sand and petroleum distillate, with coked rice hulls being preferred.

SUMMARY OF THE INVENTION

The invention encompasses a method for producing silicon carbide, including the steps of: dispersing silica particles in a residual oil to form a suspension; heating the silica-containing oil in a nonoxidizing atmosphere to carbonize the oil and thereby form a dispersion of silica in the carbonized oil; heating the carbonized dispersion in a nonoxidizing atmosphere to form silicon carbide; and recovering a silicon carbide-containing product.

Preferred residual oils have minimum boiling points about 200° C.; such oils are fluid for easy handling without a need for solvent addition, and typically have viscosities which facilitate maintaining a stable dispersion of silica during the carbonizing step. Preferred silicas for use in the invention are the higher surface area materials, such as silica gels, fumed silicas, and the like. Typically, residual oil and silica will be mixed and heated to produce a carbonized dispersion having a molar ratio of carbon to silicon in the range about 1 to 10, for the method of the invention.

DETAILED DESCRIPTION OF THE INVENTION

The invention encompasses a method for producing silicon carbide using residual oil (as the carbon source) and silica (as the silicon source) as the starting materials. As is well known, the reaction which forms the product proceeds as in (1):

$$SiO_2(s) + 3C(s) \rightarrow SiC(s) + 2CO(g) \qquad (1)$$

and a mechanism for the reaction, as described in the previously noted report by Janney et al., is thought to involve reactions (2) through (4):

$$SiO_2(s) + C(s) \rightarrow SiO(g) + CO(g) \qquad (2)$$

$$SiO_2(s) + CO(g) \rightarrow CO_2(g) + SiO(g) \qquad (3)$$

$$SiO(g) + 2C(s) \rightarrow SiC(s) + CO(g) \qquad (4)$$

a reaction sequence which is confirmed by the experimental observation that silicon carbide crystals "grow" on carbon particles. Janney et al. describe the synthesis reactions as thermodynamically feasible at temperatures above about 1350° C., and state that they are sensitive to reaction chamber pressure, and to the carbon monoxide, hydrogen, and nitrogen content of the reaction atmosphere.

Residual oils which are suitable for use in the invention are typically the higher-boiling hydrocarbon mixtures which remain following a distillation of crude oil. The distillations are normally conducted at temperatures above about 80° C. and can be used to remove crude oil components having boiling points, at atmospheric pressure, up to about 560° C. Components boiling above about 350° C. are typically distilled under reduced pressure, since heavy crude oil components are subject to thermal cracking above that temperature. The distillation residuum is a liquid having viscosities less than about 1000 poise at temperatures up to about 200° C. and is composed largely of asphaltic hydrocarbons. Continued distillation under reduced pressure, and at increased temperatures, would yield a residue known as pitch, but which does not have the presently desired fluid properties.

However, materials derived from sources other than petroleum, including mixtures of such materials with or without petroleum-derived substances, are also suitable as "residual oils" for the invention. These materials can be liquids produced from coal, shale oil liquids, liquids derived from bitumen, and the like, which are fluids having similar properties at similar temperatures as are described above for petroleum residual oils.

It should be noted that many hydrocarbon liquids which are not normally considered to be "residual" in a refinery can be used in the present invention. Suitable liquids can contain relatively low-boiling components, in combination with materials having atmospheric boiling points above about 350° C.; examples are crude petroleum and "topped" crude (which has been subjected to only a superficial distillation at low temperatures). Components of the residual oil which boil below about 350° will tend to distill away during carbonization in the present method, unless the carbonizing is conducted under a superatmospheric pressure to increase the carbon yield. Thus, the most highly preferred residual oils for use in the flowing atmosphere carbonizing procedure (discussed, infra) will have been subjected to distillation which removed components boiling up to about 350° C. at atmospheric pressure.

Several forms of silicon dioxide, including crystalline and amorphous, and mixtures of silicon dioxides are suitable as silica for use in the invention. Preferred silicas are the high surface area materials commonly called fumed silica, hydrated silica, and dried silica gel or silicic acid; these materials are usually amorphous and available in very small particle sizes, ranging down to about 70 Angstroms in the case of fumed silica. The use of silica having maximum particle sizes less than about 10 micrometers is preferred, since these smaller particles generally react at a more rapid rate and also form more uniform, stable dispersions in residual oil than is the case with larger particles.

To conduct the method of the invention, residual oil and silica are intimately mixed to form a dispersion. Amounts of the components which provide carbon to silicon molar ratios in a carbonized dispersion from about 0.1 to about 100 can be used. Preferably, the ratios will be about 1 to about 10, while the most preferred molar ratios are about 2 to about 5. Many of the preferred and most preferred ratios will produce silicon carbide products which are admixed with carbon; particularly for the fabrication of silicon carbide ceramics, or for silicon carbide whiskers which will be used to reinforce other ceramics, it is frequently preferred that excess carbon be present. As will be discussed below, techniques are available for separating silicon carbide from silica and/or carbon, if pure products are required for a specific application.

The dispersion is carbonized at temperatures about 350° C. to about 1200° C., more preferably about 500° C. to about 750° C., in a substantially nonoxidizing atmosphere. This atmosphere can be an inert gas (such as nitrogen or argon), may contain a reducing gas (such as hydrogen or carbon monoxide), or may contain gases with a higher oxidation potential such as carbon dioxide, steam, or oxygen-depleted air. Optionally, the gas atmosphere can be static or flowing past the carbonizing dispersion; flowing gases have the advantage of removing volatile organic compounds (released by the residual oil) from a heating chamber, facilitating recovery or disposal of the compounds. With some residual oils, carbonization will be promoted by partial evacuation, or pressurization, of the heating chamber which is used; either condition is permissible, as is atmospheric pressure carbonizing.

Carbonizing can conveniently be conducted as a batch-type operation by placing the silica-residual oil dispersion into a suitable temperature-resistant container, and then heating the contained dispersion in a heating chamber of appropriate capacity. The time required to carbonize the oil will vary, depending upon the container geometry, and should be determined experimentally for particular container dimensions and loading.

It has been discovered that a particularly porous, high surface area carbon is formed, which has silica particles fixed throughout its volume. For a given starting volume of dispersion, carbonizing does not appreciably reduce the volume even though the mass decreases considerably. The use of residual oils, as compared to less dense hydrocarbons such as petroleum distillates or pitch (which must be fluidized with an added solvent), is preferred since processing is facilitated. Silica is readily dispersed in residual oil and, when carbonized at atmospheric pressure, the dispersion has a high surface area, e.g., as much as 160 square meters per gram, as compared to less than 50 when distillate or pitch is used.

After carbonizing, the dispersion is heated to temperatures at least about 1200° C. to promote the silicon carbide-forming reaction. Preferred temperatures for increasing the reaction rate and degree of conversion to silicon carbide are at least about 1300° C., with the most preferred temperatures at least about 1400° C. The higher temperatures promote a more rapid formation of silicon carbide. This reaction generally should be conducted in a nonoxidizing atmosphere, similar to that used for the carbonizing step. Flowing gas atmospheres are preferable for removal of product carbon monoxide which, if present in high concentrations, could shift the reaction equilibrium away from silicon carbide formation. At temperatures above about 2000° C., silicon carbide transforms to the alpha crystal form; if the desired product is beta-silicon carbide, this temperature should not be exceeded.

The product which forms during heating is usually a cubic crystal form of silicon carbide, typically having crystallite sizes about 20 to about 40 nanometers as determined by X-ray diffraction line broadening. These crystallites form particles which are usually mixtures of powder and whisker configurations, many of which have a dimension less than about 1 micrometer, and are in admixture with unreacted carbon and/or silicon dioxide, depending upon which reactant was initially present in a stoichiometric excess and whether the reaction was permitted to proceed to completion.

If desired, the silicon carbide can be separated from carbon and silica, using methods such as froth flotation, density separations, and chemical reactions. A suitable flotation procedure is described in U.S. Pat. No. 3,319,785 to Schroll. Density separation utilizes liquids having specific gravities intermediate to those of silicon carbide (sp. gr. 3.217) and the much less dense silica and carbon. Chemically, silica can be dissolved from the mixture using hydrofluoric acid solutions, while carbon can be preferentially oxidized to form gaseous products at moderate temperatures (e.g., about 550° C.) in an oxygen-containing atmosphere. These chemical procedures will prepare a high-purity silicon carbide product.

In addition, methods are available for separating whiskers from other silicon carbide particles. U.S. Pat. No. 4,504,453 to Tanaka et al. describes a suitable separation scheme, wherein a mixture of silicon carbide whiskers, silicon carbide powder, and carbon is treated with kerosene and an aqueous solution of hydrochloric acid; whiskers preferentially enter the aqueous phase and can be recovered therefrom. B. K. Parekh and W. M. Goldberger, "Separation of Fine Size Silicon Carbide Whiskers from Coked Rice Hulls," *Minerals and Metallurgical Processing*, November, 1985, pages 227–230, discuss this technique and also describe a froth flotation separation scheme. Other separation methods are suitable for recovering silicon carbide whiskers.

Particulate products of the method of this invention are well suited for use in fabricating silicon carbide structures, due to their small particle sizes, using compacting and sintering techniques which are known in the art. The whisker products are well suited for use in reinforcing polymeric, metallic, and ceramic composite structures.

The invention will be further described by the following examples, which are not intended to be limiting, the invention being defined solely by the appended claims. In these examples, all percentage compositions are expressed on a weight basis.

EXAMPLE 1

Silicon carbide is produced using a hydrated colloidal silica (Hi-Sil™ T600 supplied by PPG Industries, Inc.) which contains about 13 percent water, has an average particle size about 21 nanometers, and has a surface area about 150 sq. meter/gram; and a residual oil which is a fraction of a Maya crude oil, having a boiling point at atmospheric pressures greater than about 340° C. When heated to about 600° C. in an inert atmosphere, this oil loses about 87 percent of its mass and yields a coke which is about 88 percent carbon.

The silica is dispersed in the oil by a thorough mixing at room temperature, and the resultant dispersion is heated to about 593° C., at a heating rate of about 333° C. per hour in a furnace which is slowly purged with nitrogen. After maintaining the 593° C. temperature for about an hour, the dispersion is rapidly cooled to room temperature, giving a very porous mixture of carbon and silica; mapping with energy dispersive X-ray techniques shows a very uniform dispersion of silicon throughout the mass.

The carbon-silica dispersion is placed into a graphite crucible and is heated in an induction furnace, in a flowing argon atmosphere, to produce silicon carbide of the cubic (beta) form. Using a carbon to silicon molar ratio of 3.8, and reacting at about 1440° C. for about 1 hour, produces a material containing beta-silicon carbide in granules which also contain carbon. The granules are easily broken, revealing many submicron-sized particles of silicon carbide.

EXAMPLE 2

Using the general procedure of the preceding example, but with a furnace which is a heated alumina tube, the residuum from a 350° C. end point atmospheric distillation of a Kuwait crude oil is mixed with the hydrated silica and heated to about 760° C. to carbonize the oil. After maintaining the carbonizing temperature about 2 hours, the mixture is cooled and analyzed, giving the following data: molar ratio of carbon to silicon, 3.3; and surface area (by BET adsorption of nitrogen), 69 square meters per gram.

A portion of the carbonized material is heated to about 1200° C. for about 30 hours in a covered graphite crucible. X-ray diffraction studies of the product indicate the presence of beta-silicon carbide. Weight loss during the heating indicates that about 5 percent of the product is silicon carbide.

EXAMPLE 3

The procedure of the preceding example is repeated with the same materials in amounts such that the carbonized dispersion formed by heating to about 740° C. and rapidly cooling, with essentially no holding time at the carbonizing temperature, has a carbon to silicon ratio of about 3.8. The carbonized mixture has a surface area about 160 square meters per gram. A product, obtained by heating the carbonized mixture at about 1500° C. for about 3 hours, is analyzed by X-ray diffraction and contains beta-silicon carbide, with a very small amount of alpha-silicon carbide.

This product is heated in air for about 16 hours at about 550° C. to remove unreacted carbon (comprising about 18 percent), is treated with aqueous hydrofluoric acid solution to remove unreacted silica (comprising about 7 percent), and is examined by scanning electron microscopy, which shows the presence of both particulate and whisker silicon carbide.

EXAMPLE 4

This example compares the production of silicon carbide using different carbon precursors: pitch and residual oil.

The pitch is Ashland A-240, a product of Ashland Oil, Inc. in Ashland, KY, which has a carbon yield about 50 percent, a softening point about 117° C., an average molecular weight about 470, and in which about 60 percent of the compounds are aromatic. A dispersion is prepared by adding toluene and stirring to produce a fluid at room temperature, adding the desired amount of the hydrated silica described in Example 1, heating at temperatures just above the boiling point of toluene until the solvent has evaporated, then carbonizing as in Example 2. The carbonized mixture has a molar ratio of carbon to silicon about 3.2 and a surface area about 46 square meters per gram.

A portion of the carbonized mixture is placed in a covered graphite crucible and is heated at about 1500° C. for about 70 minutes. Weight loss during this heating indicates that the product contains about 29 percent silicon carbide.

For comparison purposes, a portion of the carbonized mixture of Example 2 is heated at about 1500° C. for about 70 minutes, giving a product which contains about 48 percent silicon carbide, as determined by weight loss during the heating. This is a significantly higher degree of reaction than is obtained when pitch is used in the synthesis.

EXAMPLE 5

In this example, silicon carbide production from a light oil and from a residual oil are compared.

The light oil is prepared by mixing a petroleum distillate fraction boiling between about 240° C. and 550° C. with sufficient residual oil boiling above about 550° C. to constitute about 6 percent of the mixture. This light oil is mixed with hydrated silica, as in Example 1, and is heated to about 650° C. for carbonization, with a holding period at that temperature about 2 hours. The carbonized dispersion has a molar ratio of carbon to silicon about 7.4 and a surface area about 20 square meters per gram. A portion of the dispersion is heated in a covered graphite crucible at about 1500° C. for about 3 hours giving a product which contains about 5 percent silicon carbide.

For comparison, the residual oil of Example 2 is mixed with the hydrated silica and carbonized under the same conditions as above, yielding a product with a molar ratio of carbon to silicon about 6.6 and a surface area about 144 square meters per gram. When this material is heated at 1500° C., as above, the product is found to contain about 37 percent silicon carbide, substantially more than that obtained with the light oil.

Various embodiments and modifications of this invention have been described in the foregoing description and examples, and further modifications will be apparent to those skilled in the art. Such modifications are included within the scope of the invention as defined by the following claims.

What is claimed is:

1. A method for producing silicon carbide comprising the steps of:
   (a) dispersing silica particles in a residual oil;
   (b) heating the silica-containing oil in a substantially nonoxidizing atmosphere at temperatures which carbonize the oil;
   (c) heating the carbonized oil in a substantially nonoxidizing atmosphere at temperatures which induce a reaction between silica and carbon to form silicon carbide; and
   (d) recovering a silicon carbide-containing product.

2. The method defined in claim 1, wherein the silica is amorphous.

3. The method defined in claim 1, wherein the silica is selected from the group consisting of fumed silica, hydrated silica, dried silica gel, and mixtures thereof.

4. The method defined in claim 1, wherein the residual oil is crude petroleum from which components boiling below about 80° C. at atmospheric pressure have been removed.

5. The method defined in claim 1, wherein the residual oil is crude petroleum from which components boiling below about 200° C. at atmospheric pressure have been removed.

6. The method defined in claim 1, wherein the residual oil is crude petroleum from which components boiling below about 350° C. at atmospheric pressure have been removed.

7. The method defined in claim 1, wherein the residual oil is crude petroleum from which components boiling below about 560° C. at atmospheric pressure have been removed.

8. The method defined in claim 1, wherein silica is dispersed in residual oil in amounts which yield a carbonized dispersion having molar ratios of carbon to silicon from about 1 to about 10.

9. The method defined in claim 1, wherein silica is dispersed in residual oil in amounts which yield a carbonized dispersion having molar ratios of carbon to silicon from about 2 to about 5.

10. The method defined in claim 1, wherein the heating of step (b) is at temperatures from about 350° C. to about 1200° C.

11. The method defined in claim 1, wherein the heating of step (b) is at temperatures from about 500° C. to about 750° C.

12. The method defined in claim 1, wherein the residual oil is crude petroleum from which components boiling below about 350° C. at atmospheric pressure have been removed, the silica particles are dispersed in the residual oil in amounts which yield a carbonized dispersion having molar ratios of carbon to silicon ranging from about 1 to about 10, the heating of step (b) is at temperatures between about 500° C. and about 750° C. and the heating of step (c) is at temperatures between about 1400° C. and about 2000° C.

13. The method defined by claim 1, wherein the carbonized oil formed in step (b) has a surface area greater than about 50 square meters per gram.

14. The method defined in claim 1, wherein the heating of step (c) is at temperatures at least about 1200° C.

15. The method defined in claim 14, wherein the heating of step (c) is at temperatures between about 1200° C. and about 2000° C.

16. A method for producing silicon carbide comprising the steps of:
    (a) dispersing silica particles in a residual oil;
    (b) heating the silica-containing oil in a substantially nonoxidizing atmosphere at temperatures from about 350° C. to about 1200° C. to carbonize the oil;
    (c) heating the carbonized oil in a substantially nonoxidizing atmosphere at temperatures of at least about 1200° C. to form silicon carbide; and
    (d) recovering a silicon carbide-containing product.

17. The method defined in claim 16, wherein the silica particles are amorphous and are selected from the group consisting of fumed silica, hydrated silica, dried silica gel, and mixtures thereof.

18. The method defined in claim 16, wherein the residual oil is a residue from a distillation of crude petroleum at temperatures up to about 350° C.

19. The method defined in claim 16, wherein the residual oil is crude petroleum from which components boiling below about 350° C. at atmospheric pressure have been removed.

20. The method defined in claim 16, wherein the residual oil is crude petroleum from which components boiling below about 560° C. at atmospheric pressure have been removed.

21. The method defined in claim 16, wherein silica is dispersed in residual oil in amounts which yield a carbonized dispersion having molar ratios of carbon to silicon from about 1 to about 10.

22. The method defined in claim 16, wherein silica is dispersed in residual oil in amounts which yield a carbonized dispersion having molar ratios of carbon to silicon from about 2 to about 5.

23. The method defined in claim 16, wherein the heating of step (b) is at temperatures from about 350° C. to about 1200° C.

24. The method defined in claim 16, wherein the heating of step (b) is at temperatures from about 500° C. to about 750° C.

25. The method defined in claim 16, wherein the heating of step (c) is at temperatures at least about 1200° C.

26. A method for producing silicon carbide comprising the steps of:
    (a) dispersing particles of amorphous silica in a residue from a distillation of crude petroleum at temperatures;
    (b) heating the silica-containing residue in a substantially nonoxidizing atmosphere at temperatures between about 350° C. and about 1200° C. to form a carbonized dispersion having molar ratios of carbon to silicon between about 1 and about 10;
    (c) heating the carbonized dispersion in a substantially nonoxidizing atmosphere at temperatures of at least about 1400° C. to form silicon carbide; and
    (d) recovering a silicon carbide-containing product.

27. The method defined in claim 26, wherein the amorphous silica is selected from the group consisting of fumed silica, hydrated silica, dried silica gel, and mixtures thereof.

28. The method defined in claim 26, wherein the distillation has removed crude petroleum components boiling below about 350° C. at atmospheric pressure.

29. The method defined in claim 26, wherein the carbonized dispersion has molar ratios of carbon to silicon between about 2 and about 5.

30. The method defined in claim 26, wherein the heating of step (b) is at temperatures from about 500° C. to about 750° C.

31. The method defined in claim 26, further comprising the step of separating silicon carbide whiskers from the product of step (d).

32. A method for producing silicon carbide comprising the steps of:
    (a) dispersing particles of an amorphous silica selected from the group consisting of fumed silica, hydrated silica, dried silica gel, and mixtures thereof, having particle sizes less than about 10 micrometers, in a crude petroleum said crude petroleum having been treated by distillation to remove components boiling below about 350° C. at atmospheric pressure;
    (b) heating the silica-containing petroleum in a substantially nonoxidizing atmosphere at temperature between about 500° C. and about 750° C. to form a carbonized dispersion having molar ratios of carbon to silicon between about 2 and about 5;
    (c) heating the carbonized dispersion in a substantially nonoxidizing atmosphere at temperatures of at least about 1400° C. to form silicon carbide; and
    (d) recovering a silicon carbide-containing product.

33. A method for producing silicon carbide comprising the steps of:
    (a) dispersing silica particles in crude petroleum;
    (b) heating the silica-containing petroleum in a substantially nonoxidizing atmosphere at temperatures which carbonize the petroleum;
    (c) heating the carbonized dispersion in a substantially nonoxidizing atmosphere at temperatures which induce a reaction between silica and carbon to form silicon carbide; and
    (d) recovering a silicon carbide-containing product.

* * * * *

UNITED STATES PATENT AND TRADEMARK OFFICE
CERTIFICATE OF CORRECTION

PATENT NO. : 4,839,150

DATED : 06/13/89

INVENTOR(S) : Roy T. Coyle, Phillman N. Ho

It is certified that error appears in the above-identified patent and that said Letters Patent is hereby corrected as shown below:

Col. 9, line 18, claim 26, after "temperatures" and before ";" insert -- between about 200° C. and 560° C. --.

Signed and Sealed this

Tenth Day of July, 1990

Attest:

HARRY F. MANBECK, JR.

*Attesting Officer*  *Commissioner of Patents and Trademarks*